United States Patent [19]

Yamada et al.

[11] Patent Number: 4,656,426

[45] Date of Patent: Apr. 7, 1987

[54] NUCLEAR MAGNETIC RESONANCE DATA PROCESSING METHOD

[75] Inventors: Noriaki Yamada; Kazuya Hoshino; Tadashi Sugiyama; Hiroyuki Matsuura, all of Tokyo, Japan

[73] Assignees: Yokogawa Hokushin Electric Corporation; Yokogawa Medical Systems, Limited, both of Tokyo, Japan

[21] Appl. No.: 806,038

[22] Filed: Dec. 6, 1985

[30] Foreign Application Priority Data

Dec. 18, 1984 [JP] Japan .................................. 59-266774

[51] Int. Cl.⁴ .............................................. G01R 33/20
[52] U.S. Cl. ...................................... 324/309; 324/307
[58] Field of Search ................ 324/300, 307, 309, 312

[56] References Cited

U.S. PATENT DOCUMENTS 4,616,183 10/1986 Glover et al. ...................... 324/309

FOREIGN PATENT DOCUMENTS 0119802 9/1984 European Pat. Off. ............ 324/307
0203634 10/1983 German Democratic Rep. ..................................... 324/307
2129943 5/1984 United Kingdom ................ 324/307

OTHER PUBLICATIONS

Lai et al., "Automatic Correction of Nuclear Magnetic Resonance Zeugmatographic Projections", Journal of Physics E: Sci. Instrum., vol. 14, 1981.

Primary Examiner—Stewart J. Levy
Assistant Examiner—Kevin D. O'Shea
Attorney, Agent, or Firm—Moonray Kojima

[57] ABSTRACT

An NMR data processing method for use with an NMR tomograph, wherein signals, located in a period before and after an NMR signal to be sampled and containing substantially none of the NMR signal component, are measured as offset data for each view, so that even the offset slightly fluctuating in the view can be corrected for the NMR signal, on the basis of that data.

1 Claim, 3 Drawing Figures

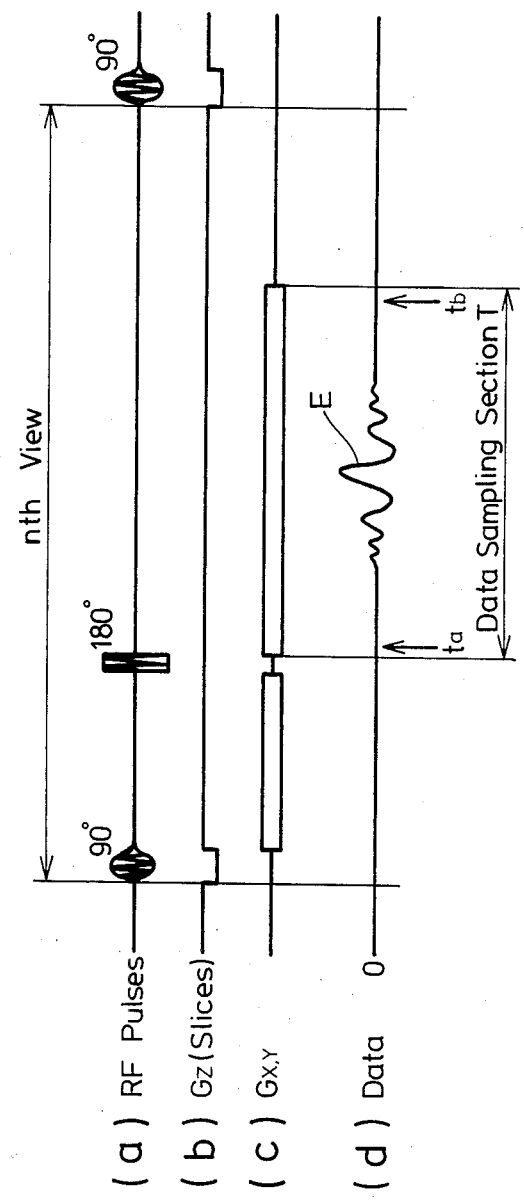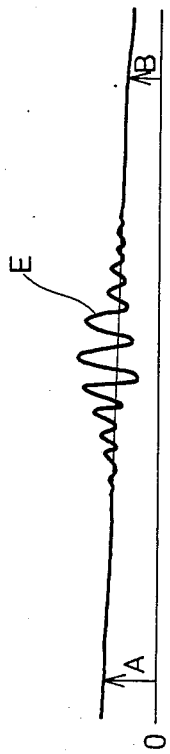

NUCLEAR MAGNETIC RESONANCE DATA PROCESSING METHOD

BACKGROUND OF THE INVENTION

1. Field of Invention

This invention relates to an image data processing method for use with a nuclear magnetic resonance (hereinafter called "NMR") tomograph for observing the internal structure of an object as a sectional image by using the NMR phenomenon; and more particularly, to an offset correction of the image data of the tomogram.

2. Description of Prior Art

The data obtained from an NMR tomograph is not a practical useable image as it is because the data contains various noises. Most of these noises can be corrected by a numerical processing using a variety of physical properties, but either noises intrinsic to the tomograph or transient noises usually remain uncorrected by the numerical processing.

Also, the DC level of the image data will vary for each view, due to fluctuations in the gain of an amplifier and the offset value of an analog-digital converter. This variation forms a salience of the DC component in the image and establishes a bright spot or line, as an arch fact, to seriously degrade the quality of the image.

In order to solve this problem, there has been widely used a method wherein such data, as can be interpreted to contain few image signals, are sampled either in succession to or prior to the image data so that their average value is used as an offset value of the view.

However, this method is accompanied by a problem, wherein the offset cannot be sufficiently corrected in case it has a gradient. In case the gradient of the offset is dependent upon RF pulses, gradient magnetic field fluctuations, etc, more specifically, it is common among the views that a sufficiently effective correction can be accomplished by averaging the signal-less views and portions and by data processing the averaged one as an offset file. However, even this method is still defective in that an uncorrectable offset remains in case the offset has a gradient which is irregular for each view and exhibits gentle and slight changes in the view.

SUMMARY OF THE INVENTION

Accordingly, an object of the invention is to overcome the aforementioned and other deficiencies and disadvantages of the prior art.

Another object is to provide an image data processing method which improves the image quality by eliminating the offset components having little correlation for each view and gently changing the view.

The foregoing and other objects are attained by the invention, wherein when an NMR signal is to be generated by an echo method, offset data are sampled for each view before and after the echo signal so that the offset value which are changing more or less in the view may be corrected by making use of such data.

BRIEF DESCRIPTION OF DRAWINGS

FIG. 2 is an operating waveform chart for explaining the sequences of the invention.

FIG. 3 is a waveform chart for explaining one example of an NMR signal.

DETAILED DESCRIPTION OF PREFERRED EMBODIMENTS

Figure 1:
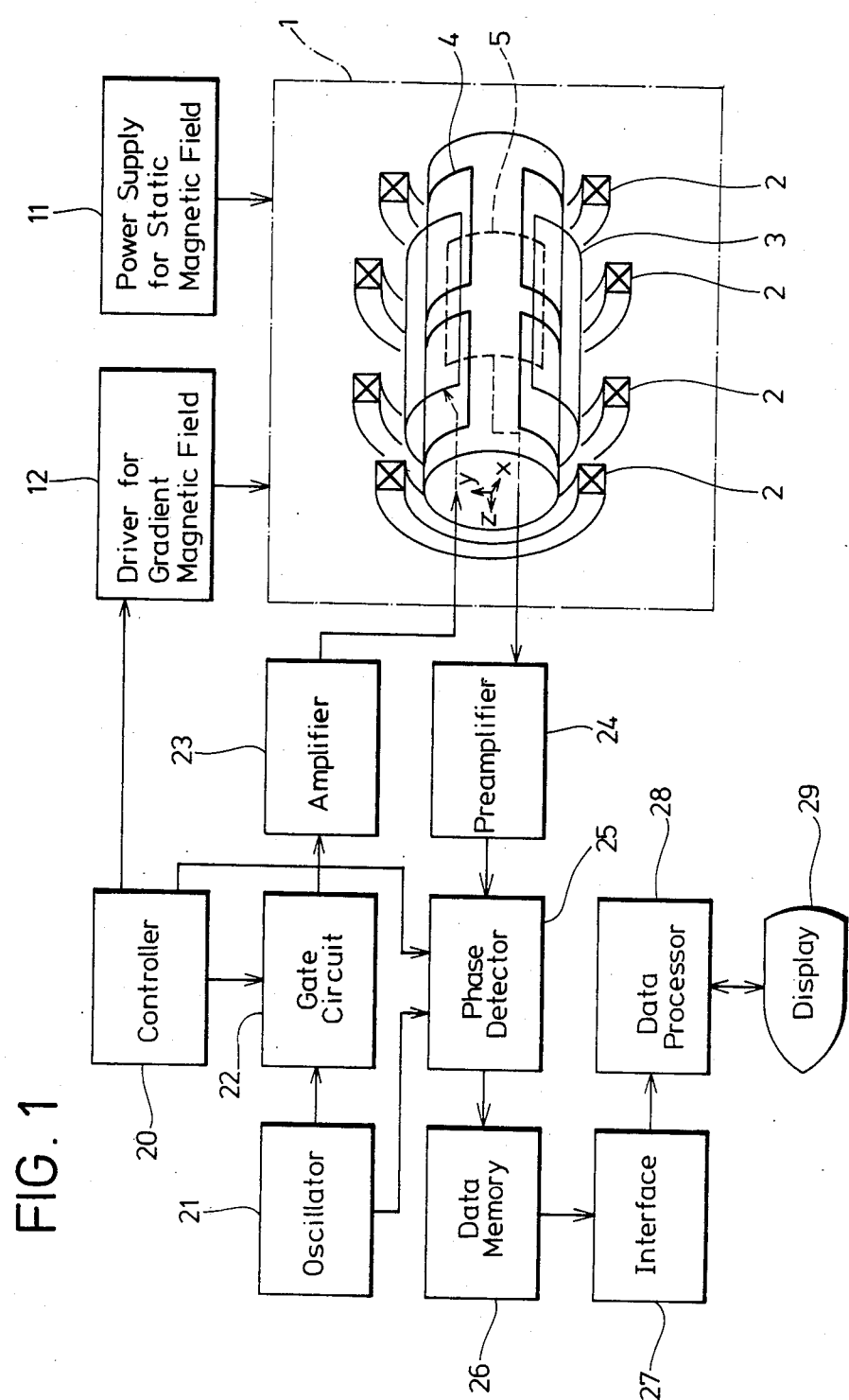
FIG. 1 is a block diagram depicting essential parts of an NMR tomograph for practicing the inventior.

The invention will now be described with reference to all the figures in the drawing. As shown in FIG. 1, a magnetic assembly 1 comprises static magnetic field coils 2 for applying a constant magnetic field to a test piece; an exciting coil 3 for generating RF pulses for exciting nuclear spins; a gradient magnetic field coil 4 (which comprises x-, y-, and z-gradient magnetic coils structured for generating gradient magnetic fields in the respective x-, y-, and z-axes directions) for applying a gradient magnetic field by which information of the location of the test piece is reflected upon the signals; and a detecting coil 5 for detecting the NMR signals from the test piece. The individual coils are partially shown in FIG. 1 by way of example.

A power supply 11 is used for supplying current to static magnetic field coils 2. A driver 12 is provided for supplying current to the gradient magnetic coils 4. The driver 12 is controlled by a controller 20.

An oscillator 21 generates a signal (such as an RF signal) having a frequency (e.g. 42.6 MHz/T for protons), which conforms to the NMR conditions of the nuclei to be measured. Oscillator 21 has its output applied to the exciting coil 3 via a gate circuit 22, which is switched in response to a signal from controller 20, and via a power amplifier 23. Another amplifier 24 amplifies the NMR signal, obtained from detecting coil 5, and supplies the amplified signal to phase dectector 25, which is connected to data memory 26. Data memory 26 stores the signal coming from amplifier 24 after the signal has its phase detected by detector 25. The memory 26 may include an A/D converter. The phase detector has RF signals applied from oscillator 21 and is under the control of controller 20. A data processor 22, which is made receptive of the signals from the data memory 26 via an interface 27, subjects such signals to a predetermined signal processing to form a sectional image. The sectional image is then displayed in display 29 which may be a TV monitor.

The operation of the foregoing system configuration will now be described, in connection with one example of the case wherein the saturation restoring method (i.e. the SR method) and the spin echo method (i.e. SE method) are adopted. The operation is conducted in the sequence shown in FIG. 2, under control instructions of controller 20.

In the state wherein an electric current is introduced from static magnetic power supply 11 to static magnetic field coils 11 so that a static magnetic field Ho is applied to the test piece (which is placed in the cylinder of the coils), gate circuit 22 is opened by controller 20 to feed the RF signal modulated into a predetermined form (e.g. a Gaussian form) to exciting coil 3 via amplifier 23, thereby to feed pulses of 90° to the test piece.(see line (a) of FIG. 2).

Subsequently, gradient magnetic field coil 4 is energized by driver 12 under control of controller 20, to both the z-gradient magnetic field for determining the slice planes and the x-and y-gradient magnetic fields for projections, as shown in line (b) and line (c) of FIG. 2.

A predetermined period after the application of the RF pulses of 90°, exciting coil 3 is energized by signals from oscillator 21 as gated by gate 22 and amplified by amplifier 23 to apply pulses of 180° to the test piece. During this application of the 180° RF pulses, neither the x-gradient magnetic field nor the y-gradient magnetic field are applied.

After the aforementioned application of the 180° pulses, the x- and y-gradient magnetic fields are applied again. As a result, an echo signal is generated, as shown in line (d) of FIG. 2, and is detected by detecting coil 5, and is introduced into data memory 26 via amplifier 24 and phase detector 25.

As shown in line (d) of FIG. 2, it can be considered that few signal components are contained at an instant sufficiently before and after the peak of the echo signal in Data Sampling Section T for which the data are sampled by applying Gx,y (wherein the "instant" may be a short period of time including the preceding and succeeding periods thereof and therefore implies the Section itself) and that the signal value (or a representative value such as the value averaged for that short section) is the DC offset value at that instant. In dependence upon the various conditions of the tomograph, the offset value not only disperses for each view, but also frequently has a gradient in the view. In other words, a difference may exist between the offset value (as indicated at A and B in FIG. 3) at a preceding instant of time $t_a$ and at a succeeding instant of time $t_b$ (see FIG. 2, line (d)).

In data processor 28, the offset values in the view at the respective instants $t_a$ and $t_b$ are subjected to approximation of the first order from the NMR signals detected, and the sampled values at the respective instants are subtracted from those offset values.

A more accurate offset correction can be performed by the correcting method described above.

Since the offset values A and B are not extremely different in a practical tomograph; however, the offset value at the instant corresponding to the center of the echo signal may be determined and used as that of all the sampled values. In this case, the weighted mean of the offset values A and B, considering the distance from instants $t_a$ and $t_b$ from the instant correponding to the echo signal, is adopted as the offset value being sought.

Moreover, the approximation should not be limited to that of the first order, but may be developed to one of an nth order or affected by an exponential function, or the like. On the other hand, the number of sampling points of the offset values should not be limited to two, but may be increased to a suitable number.

Moreover, the invention is not limited in its application to the SR-SE method, but can be applied to any pulse sequence, if the echo method is used.

As has been described above, according to the invention, in the NMR tomograph, the offset values, from the instant when the signals preceding and succeeding the echo signal are sufficiently small, are determined and are functionally approximated as the offset value sought for each view. As a result, it is possible to accomplish the offset correction simply and to form an image of high quality, and which image is free of a bright point, or line, as might otherwise be formed as the result of the residual DC component.

The foreoing description is illustrative of the principles of the invention. Numerous modifications and extensions thereof would be apparent to the worker skilled in the art. All such modifications and extensions are to be considered to be within the spirit and scope of the invention.

What is claimed is:

1. A nuclear magnetic resonance data processing method for use with a nuclear magnetic resonance tomograph having an echo method used in connection therewith, said method comprising the steps of measuring signals at various times slots positioned before and after the peak of an echo signal and containing substantially none of the echo signal;

introducing the measured signals as offset data; and determining the offset of said echo signal by an approximation using said offset data, said offset being subtracted from said echo signal, thereby to process offset correction of said echo signal.